(12) United States Patent
Petz et al.

(10) Patent No.: US 10,304,749 B2
(45) Date of Patent: May 28, 2019

(54) METHOD AND APPARATUS FOR IMPROVED ETCH STOP LAYER OR HARD MASK LAYER OF A MEMORY DEVICE

(71) Applicant: Intel Corporation, Santa Clara, CA (US)

(72) Inventors: Christopher W. Petz, Boise, ID (US); Philip M. Campbell, Round Rock, TX (US); Wei Yeeng Ng, Boise, ID (US); Kunal Bhaskar Shrotri, Boise, ID (US); Saurabh Keshav, Boise, ID (US); John Mark Meldrim, Boise, ID (US); Prakash Rau Mokhna Rau, Boise, ID (US); Tom Jibu John, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/627,676

(22) Filed: Jun. 20, 2017

(65) Prior Publication Data

US 2018/0366386 A1    Dec. 20, 2018

(51) Int. Cl.
  *H01L 21/02*       (2006.01)
  *H01L 23/29*       (2006.01)
  *H01L 27/11524*    (2017.01)
  *H01L 27/1157*     (2017.01)

(52) U.S. Cl.
  CPC ...... *H01L 23/291* (2013.01); *H01L 21/02145* (2013.01); *H01L 21/02194* (2013.01); *H01L 21/02266* (2013.01); *H01L 27/1157* (2013.01); *H01L 27/11524* (2013.01)

(58) Field of Classification Search
  CPC .................................................... H01L 23/291
  See application file for complete search history.

(56) References Cited

U.S. PATENT DOCUMENTS

| 2005/0045966 | A1* | 3/2005  | Yamashita | H01L 27/115 257/390 |
| 2007/0287254 | A1* | 12/2007 | Natori    | H01L 27/115 438/264 |
| 2008/0054341 | A1* | 3/2008  | Natori    | H01L 21/28273 257/316 |
| 2009/0242969 | A1* | 10/2009 | Tanaka    | H01L 21/76224 257/324 |
| 2014/0070290 | A1* | 3/2014  | Inumiya   | H01L 43/10 257/295 |
| 2017/0062337 | A1* | 3/2017  | Park      | H01L 23/5283 |

* cited by examiner

*Primary Examiner* — Eugene Lee
(74) *Attorney, Agent, or Firm* — Alliance IP, LLC

(57) ABSTRACT

In one embodiment, an apparatus comprises an etch stop layer comprising Aluminum Oxide and one or more of Hafnium, Silicon, or Magnesium; and a channel formed through one or more layers deposited over the etch stop layer, the channel extending to the etch stop layer.

13 Claims, 10 Drawing Sheets

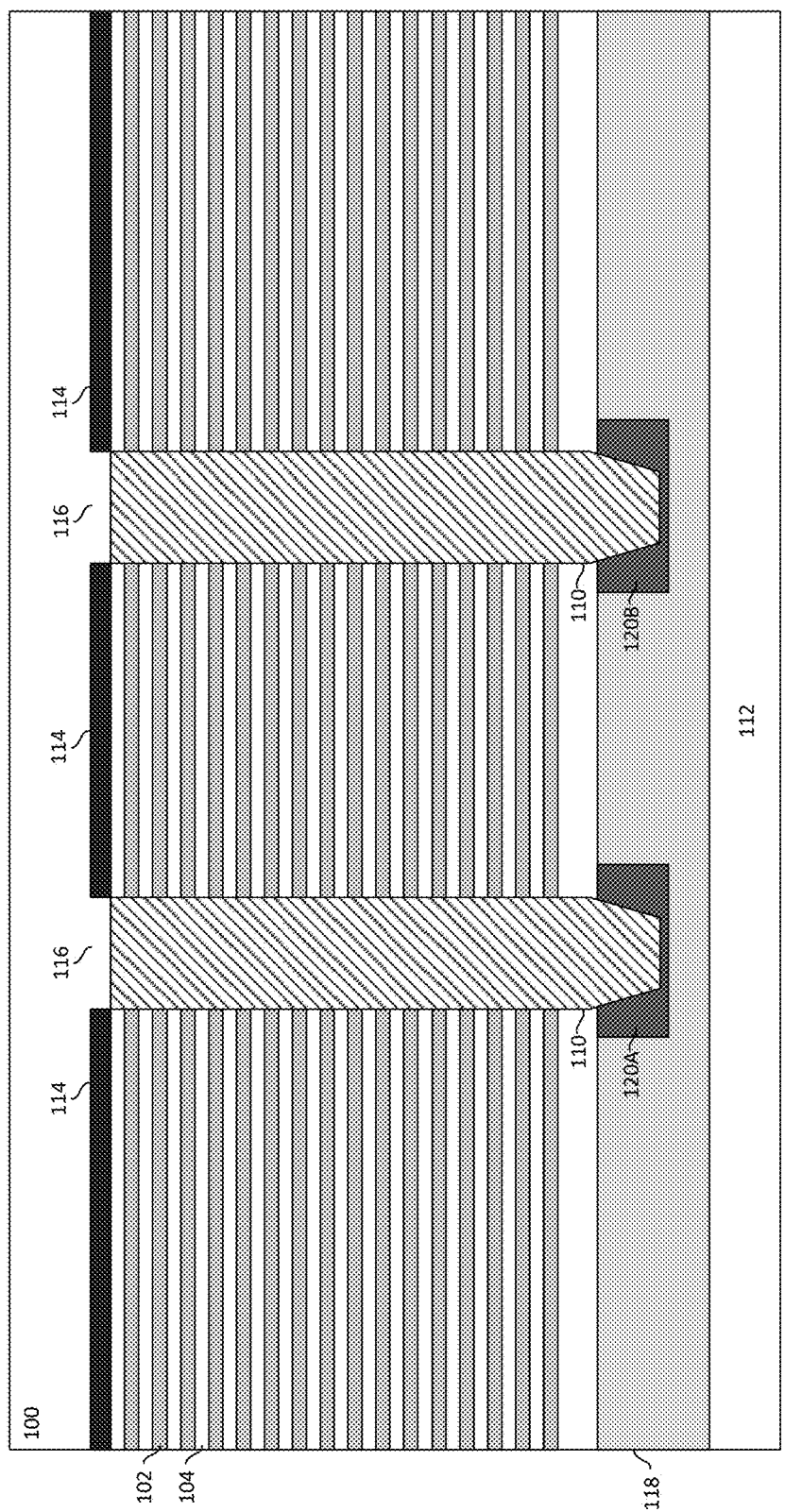

METHOD AND APPARATUS FOR IMPROVED ETCH STOP LAYER OR HARD MASK LAYER OF A MEMORY DEVICE

FIELD

The present disclosure relates in general to the field of computer development, and more specifically, to memory devices.

BACKGROUND

A memory device may include one or more semiconductor memory chips that each comprise one or more arrays of memory cells to store data. During fabrication of the memory device, various layers may be deposited over a substrate. Fabrication may also involve applying masks and etching through portions of one or more of the layers.

BRIEF DESCRIPTION OF THE DRAWINGS

FIG. 10 illustrates a horizontal cross section of a portion of a memory chip with a discontinuous etch stop layer in accordance with certain embodiments.

Like reference numbers and designations in the various drawings indicate like elements.

DETAILED DESCRIPTION

The concepts of various embodiments are applicable to memory devices used in any suitable computer systems. Examples of systems in which teachings of the present disclosure may be used include desktop computer systems, server computer systems, storage systems, handheld devices, tablets, other thin notebooks, system on a chip (SOC) devices, and embedded applications. Some examples of handheld devices include cellular phones, digital cameras, media players, personal digital assistants (PDAs), and handheld PCs. Embedded applications may include microcontrollers, digital signal processors (DSPs), SOCs, network computers (NetPCs), set-top boxes, network hubs, wide area networks (WANs) switches, or any other system that can perform the functions and operations taught below. Various embodiments of the present disclosure may be used in any suitable computing environment, such as a personal computing device, a server, a mainframe, a cloud computing service provider infrastructure, a datacenter, a communications service provider infrastructure (e.g., one or more portions of an Evolved Packet Core), or other environment comprising one or more computing devices.

Figure 1:
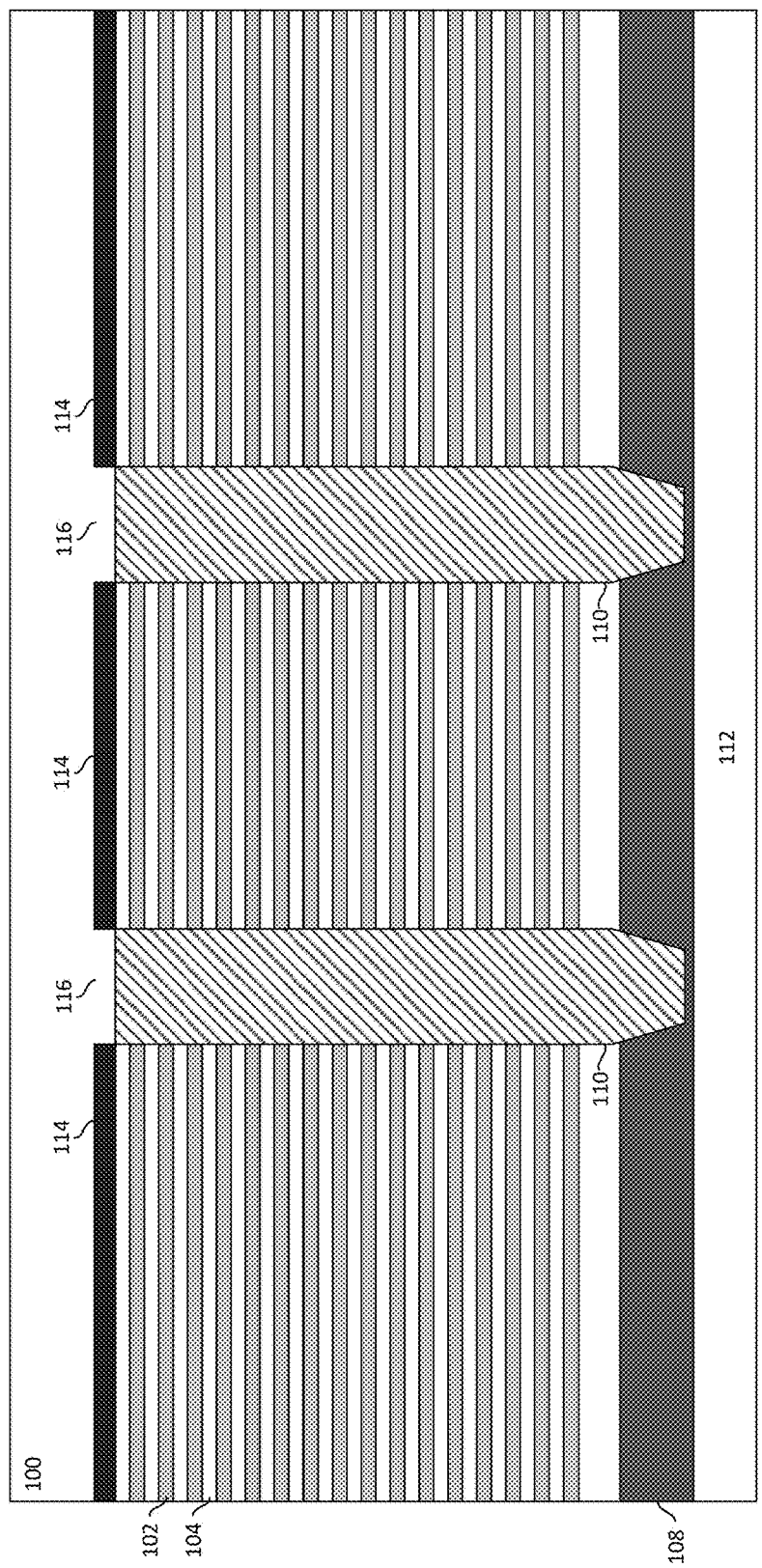
FIG. 1 illustrates a horizontal cross section of a portion of a memory chip with a blanket etch stop layer in accordance with certain embodiments.

FIG. 1 illustrates a horizontal cross section of a portion of a memory chip 100 with a blanket etch stop layer 108 in accordance with certain embodiments. In various embodiments, memory chip 100 may comprise a 3D NAND flash memory array, although the teachings of the present disclosure may be applied to any suitable semiconductor device. Memory chip 100 comprises a tier formed of alternating layers of polysilicon 102 and a dielectric material 104 such as an oxide (e.g., silicon dioxide), a silicate glass, a low-k insulator (such as silicon oxycarbide), or other suitable dielectric material. The layers are disposed in a generally horizontal manner across the memory chip 100. In a particular embodiment, these layers may be formed through deposition over a substrate 112 (there may be one or more other intervening layers formed between the tier and the substrate, such as etch stop layer 108, one or more lower metal layers, or other suitable layers). Any suitable deposition process may be used to form a polysilicon layer or a dielectric layer of the tier, such as physical vapor deposition (PVD), chemical vapor deposition (CVD), electrochemical deposition (ECD), molecular beam epitaxy (MBE), atomic layer deposition (ALD), or other suitable deposition process.

In various embodiments, any suitable number of polysilicon layers 102 and dielectric layers 104 may be present in the tier of memory chip 100. The memory cells of the memory chip 100 may be formed in the polysilicon layers 102. In a particular embodiment, a plurality of the polysilicon layers 102 (e.g., the majority of the polysilicon layers) are further processed to form active wordlines of memory arrays (with one or more wordlines formed in each polysilicon layer 102). One or more other polysilicon layers 102 may be used to form dummy wordlines and/or source and drain select gates.

Although this disclosure focuses on a tier that includes alternating polysilicon layers 102 and dielectric layers 104, any of the embodiments described herein may utilize layers comprising any suitable conductive material or layers including polysilicon and one or more other materials in place of the polysilicon layers. Thus, a tier may comprise alternating layers of dielectric materials and any suitable conductive layers (i.e., layers that comprise (at least in part) conductive materials such as polysilicon, tungsten, other metal, or other suitable conductive material). In a particular embodiment, a tier may be formed by depositing alternating layers of silicon nitride and a dielectric material. In some embodiments, during fabrication of the memory device 100, at least a portion of the silicon nitride may be exhumed and replaced with a conductive material. In particular embodiments, the tier may be formed using any suitable alternating layers to form arrays of replacement gate or charge trap NAND memory cells.

Substrate 112 may comprise any suitable solid substance onto which a layer of another substance may be applied. For example, substrate 112 may be a thin slice of one or more of silicon, silicon dioxide, aluminum oxide, sapphire, germanium, gallium arsenide, an alloy of silicon and germanium, indium phosphide, or other suitable material. Various circuitry associated with memory chip 100 may be formed on the substrate, such as sense amplifiers, decoders, pull up or pull down drivers, electrostatic protection circuitry, or other circuitry.

During fabrication, a hard mask 114 may be applied on top of the tier (in various embodiments, one or more other intervening layers may be resident between the hard mask and the tier). The hard mask may include various apertures 116 demarking desired etch locations. A dry etch material may then be applied. The hard mask may be resistant to the dry etch material such that it protects the underlying tier from the dry etch material. The dry etch may etch channels 110 down through the tier at the locations of the apertures 116. In a particular embodiment, the channels may be used to form strings (e.g., wordlines) of NAND cells. In particular embodiments, the channels may be NAND pillars in a 3D NAND memory chip. In various embodiments, after the channels are formed, they may be filled with a dielectric material and/or other suitable materials in order to create NAND cells. In various embodiments, various hard masks may be applied in conjunction with various etching steps (e.g., to form vias or channels to each layer of polysilicon).

The etch stop layer 108 may provide a buffer between the bottom of the tier and other portions (e.g., layers) of the wafer disposed below the etch stop layer 108. In a particular embodiment, the etch stop layer 108 covers an entire wafer (i.e., the etch stop layer 108 is a "blanket layer"). In other embodiments, the etch stop layer is not a blanket layer, but may comprise deposits of the etch stop material at various discontinuous locations of the wafer (e.g., in the same horizontal plane). A particular embodiment where the etch stop layer 108 is not a blanket layer is discussed below in connection with FIG. 10.

The composition of the etch stop layer 108 and/or the composition of the hard mask layer 114 may have important effects on the fabrication of the memory device 100. The etch stop layer 108 may be relatively dry etch resistant (i.e., have a low dry etch rate), but after the dry etch is applied, residue material (from the etch stop layer 108) in the channel may be removed using a wet etch material. If the wet etch rate of the etch stop layer 108 is too high, the wet etch may remove material of the etch stop layer 108 in a horizontal direction and the tier may then be susceptible to peeling from the wafer. However, if the wet etch rate of the etch stop layer 108 is too low, the residue may not be sufficiently removed. As another example, if the crystallization temperature of the etch stop layer 108 is too low, the etch stop layer may crystallize, making removal of residual etch stop layer material from the channel 110 more difficult and/or expensive.

In various embodiments, the compositions used for etch stop layer 108 may have one or more characteristics that are superior to characteristics of other materials that may be used for the etch stop layer such as Aluminum Oxide (AlOx). In particular embodiments, the compositions used for hard mask layer 114 may have one or more characteristics that are superior to characteristics of other materials that may be used for the hard mask layer 114 such as CVD Carbon, Tungsten-doped Carbon, or other hard masks with high metal content.

Various embodiments of the present disclosure provide compositions with improved characteristics for etch stop layer 108 and/or hard mask layer 114. In particular embodiments, etch stop layer 108 may comprise Aluminum Oxide combined with one or more of Hafnium (Hf), Silicon (Si), or Magnesium (Mg). For example, etch stop layer 108 may comprise one or more of Aluminum Hafnium Silicon Oxide (i.e., $Al_vHf_wSi_xO_y$), Aluminum Hafnium Oxide (i.e., $Al_vHf_wO_y$), Aluminum Magnesium Hafnium Oxide (i.e., $Al_vMg_zHf_wO_y$), or Aluminum Magnesium Hafnium Oxide (i.e., $Al_vMg_zSi_xO_y$), where v, w, x, y, and z may be any suitable integers. In particular embodiments, hard mask layer 114 may comprise Magnesium Oxide (MgO) combined with one or more of Aluminum, Hafnium, or Silicon. Various embodiments may provide an etch stop layer 108 with an improved crystallization temperature, dry etch rate, and/or wet etch rate. Particular embodiments may provide a hard mask layer 114 with an improved dry etch rate, wet etch rate, and/or optical transparency.

Figure 2:
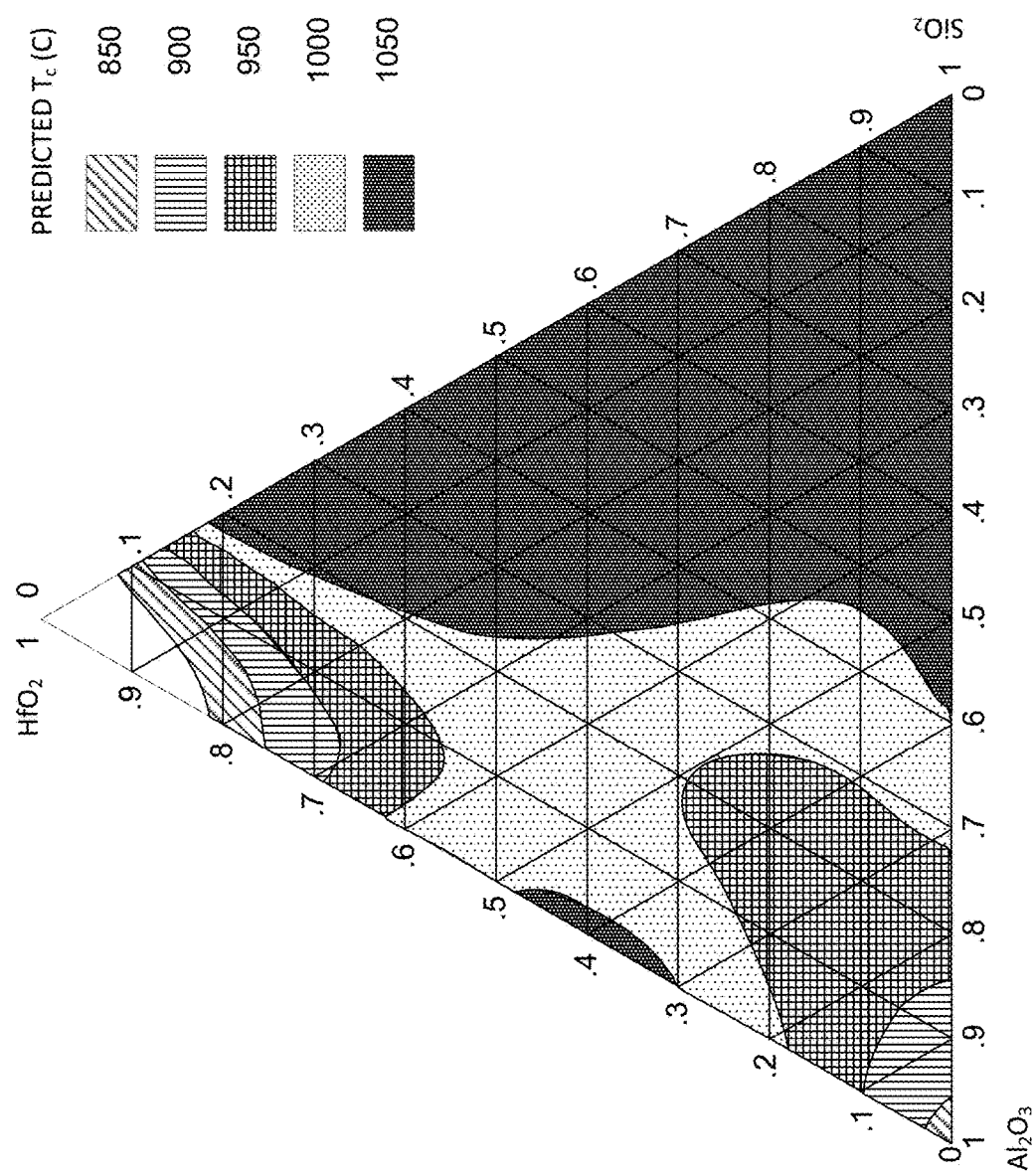
FIG. 2 illustrates a ternary phase diagram for predicted crystallization temperatures for various combinations of Hafnium Oxide ($HfO_2$), Aluminum Oxide ($Al_2O_3$), and Silicon Dioxide ($SiO_2$) in accordance with certain embodiments.

FIG. 2 illustrates a ternary phase diagram for predicted crystallization temperatures for various combinations of Hafnium Oxide ($HfO_2$), Aluminum Oxide ($Al_2O_3$), and Silicon Dioxide ($SiO_2$) in accordance with certain embodiments. Each axis represents a percentage of composition of a particular compound. Each apex of the triangle represents a composition of 100% of a particular compound and the line opposite the apex represents a composition of 0% of the particular compound. The percentage of a specific compound decreases linearly with increasing distance from the relevant apex (the points on a particular line that is opposite to an apex each represent the percentage of the compound specified by label on the axis associated with that compound).

As depicted, a composition of pure $Al_2O_3$ has a relatively low crystallization temperature ($T_c$) as does a composition of pure $HfO_2$. For example, pure $Al_2O_3$ and pure $HfO_2$ may have crystallization temperatures of 900° C. or below. Pure $SiO_2$ has a crystallization temperature higher than 1100° C. However, when $Al_2O_3$ is mixed with particular amounts of $HfO_2$ and/or $SiO_2$, the crystallization temperature rises. Thus, an etch stop layer comprising $Al_vHf_wSi_xO_y$ or $Al_vHf_wO_y$ may have a higher crystallization temperature than an etch stop layer of $Al_2O_3$. In various embodiments, the etch stop layer 108 may comprise $Al_2O_3$ combined with one or both of $HfO_2$ and $SiO_2$ such that the composition ratio of the etch stop layer 108 is located within one of the depicted regions having a crystallization temperature above 1000° C. (or a region having a crystallization temperature above 1050° C.). In various embodiments, by adding a small amount of $HfO_2$ to $Al_2O_3$ (e.g., 15-40% $HfO_2$), the crystallization temperature of the film is increased to greater than 1025° C. In particular embodiments, the composition may be $Al_vHf_wSi_xO_y$ comprising 25% or more $SiO_2$. In some embodiments, a moderate to large amount of $SiO_2$ added to the $Al_2O_3$ may result in similar increases in temperature.

In various embodiments, the increase in temperature may be sufficient to prevent crystallization of the etch stop layer during a rapid thermal processing (RTP) spike anneal process step that is performed to activate implants and dopants. In various embodiments, the anneal may be performed at a high temperature, such as roughly 1000° C. Crystallization of Aluminum Oxide may result in the inability to remove the Aluminum Oxide from peripheral regions of the channel 110 using standard wet chemistries. Accordingly, the crystalized Aluminum Oxide may be re-amorphized (e.g., via an Argon beamline implant) so it can be removed by a wet etch. However, this may be a very expensive step. By using a composition for the etch stop layer 108 that has a higher crystallization temperature than the temperature applied during the anneal phase, the etch stop 108 is not crystallized during the anneal phase, and the composition of the etch stop 108 may be removed using a wet etch comprising any one or more of hydrofluoric acid, nitric acid, water, ammonium fluoride, phosphoric acid, acetic acid, or other suitable etching material.

The wet etch rate of the etch stop layer 108 may also be tunable by varying the amount of Hafnium and/or Silicon in the etch stop layer 108 (e.g., by varying the amount of $HfO_2$ and/or $SiO_2$ combined with $Al_2O_3$ to form the etch stop layer 108). If the wet etch rate is too high, the wet etch may be difficult to control, while if the wet etch rate is too low, the etch may be ineffective. In various embodiments, the composition may be tuned to have a wet etch rate that is similar to the wet etch rate of $Al_2O_3$ (or other suitable wet etch rate). Because the desirable wet etch rate may vary by process, the tunability of the wet etch rate based on the composition of the etch stop layer may facilitate fabrication of a variety of memory or other semiconductor devices.

Figure 3:
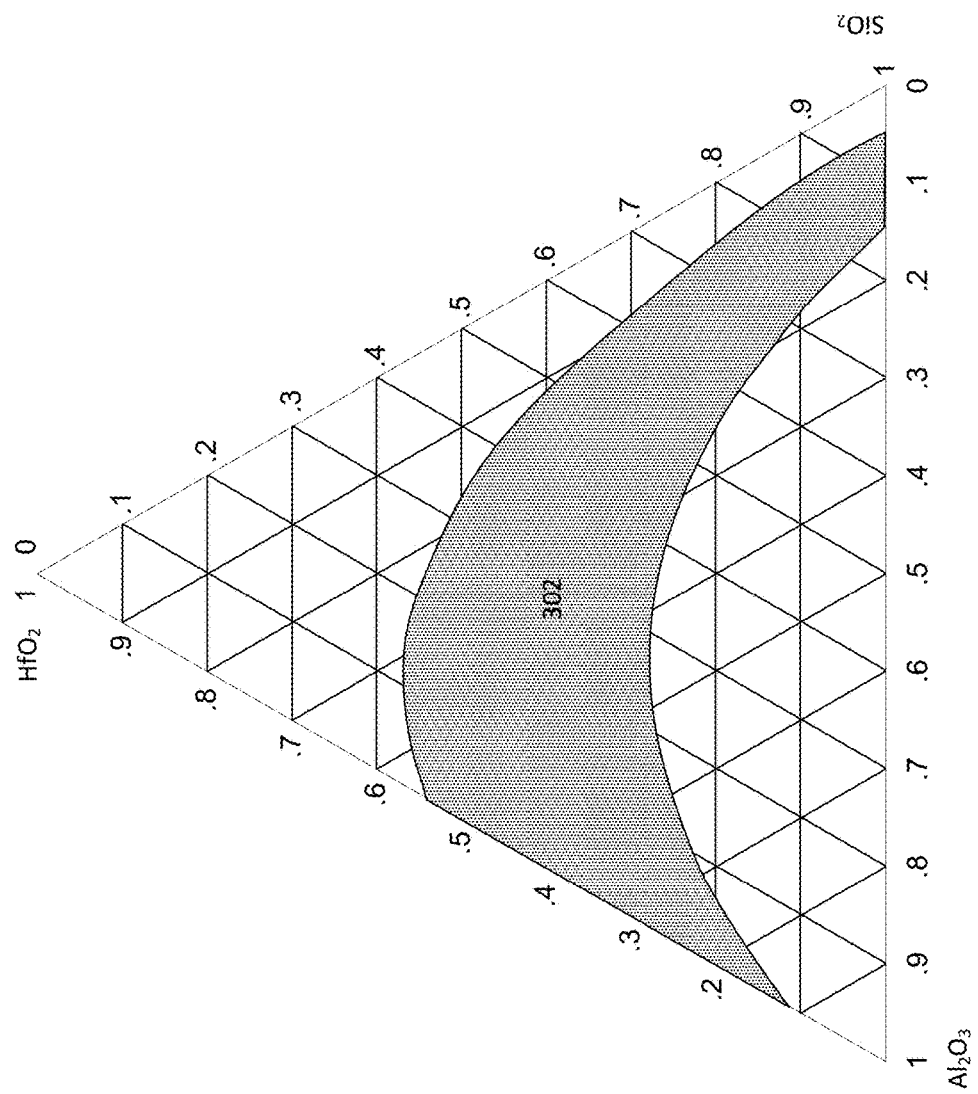
FIG. 3 illustrates a ternary phase diagram depicting a particular region of compositions for an etch stop layer that provide a favorable crystallization temperature and wet etch rate in accordance with certain embodiments.

FIG. 3 illustrates a ternary phase diagram depicting a particular region 302 of compositions that provide a favorable crystallization temperature and wet etch rate in accordance with certain embodiments. In some embodiments, the wet etch rate of the depicted region is greater than 20 angstroms per minute when a 2000:1 dilute HF mixture (i.e., 2000 parts water to 1 part hydrofluoric acid) is applied as the wet etch. In particular embodiments, the composition of the etch stop layer 108 may comprise between 20% and 60% of $HfO_2$. In particular embodiments, the composition of the etch stop layer 108 results in a wet etch rate of 20 and 300 angstroms per minute when a 2000:1 dilute HF solution is used.

Figure 4:
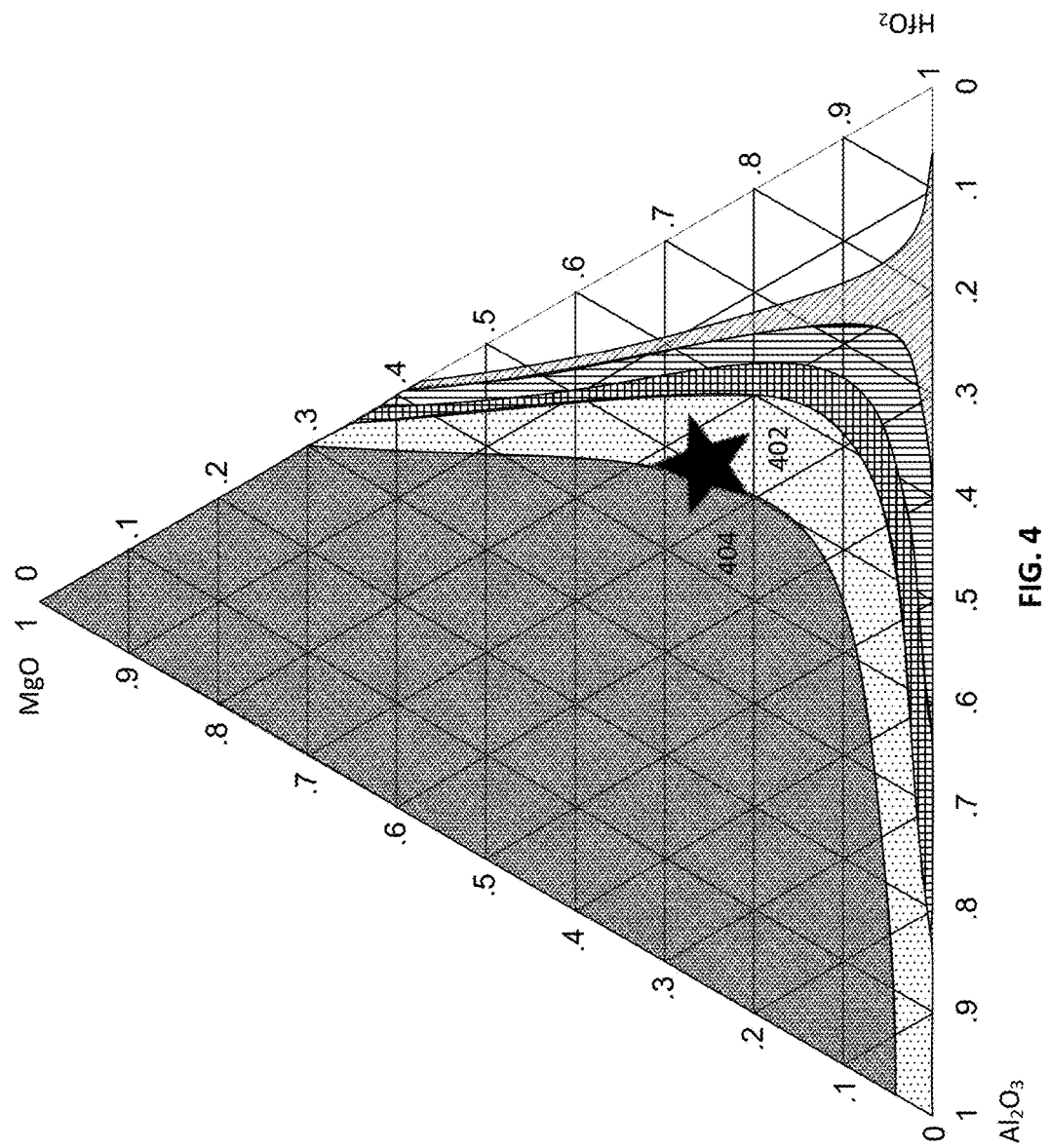
FIG. 4 illustrates a ternary phase diagram for predicted wet etch rates for various combinations of Magnesium Oxide (MgO), Aluminum Oxide ($Al_2O_3$), and Hafnium Oxide ($HfO_2$) in accordance with certain embodiments.
Figure 5:
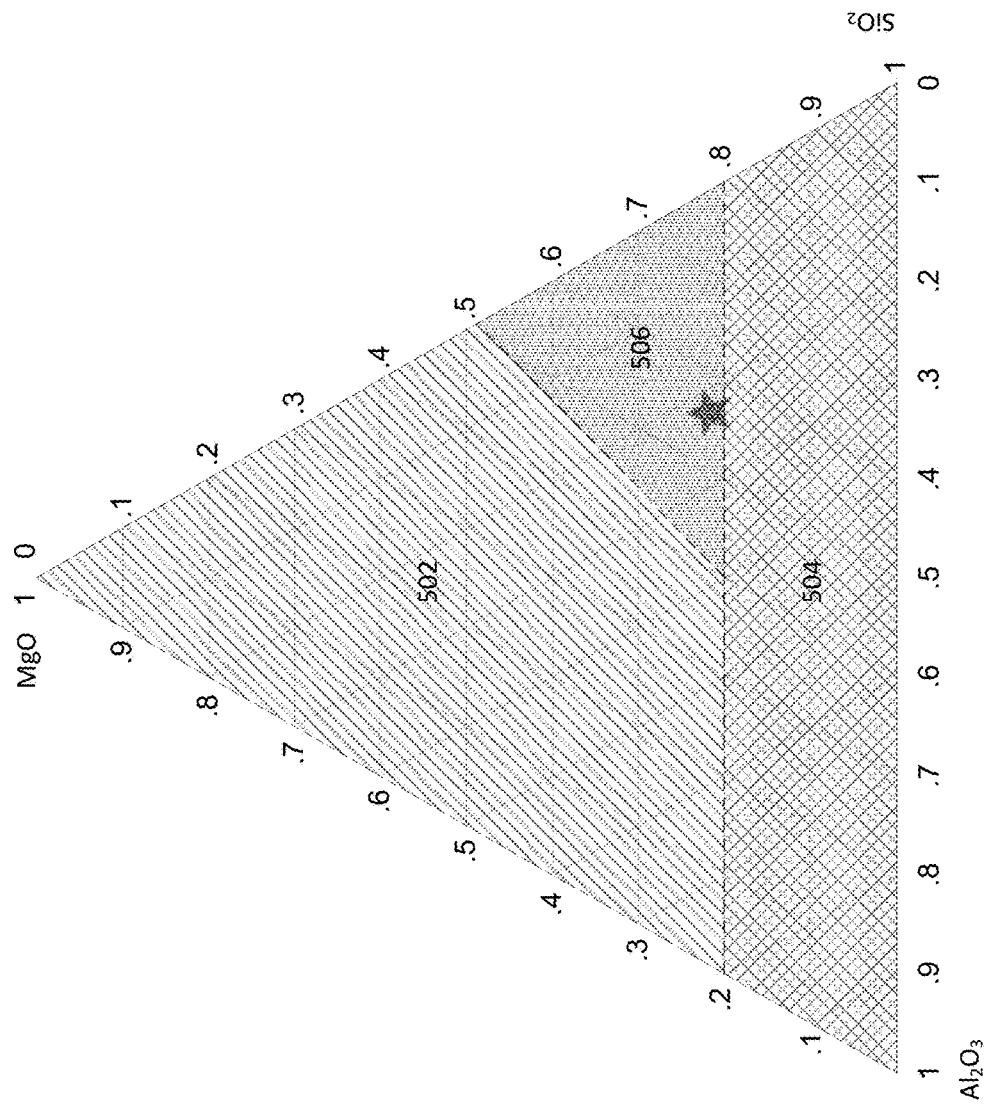
FIG. 5 illustrates a ternary phase diagram for predicted etch rates for various combinations of Aluminum Oxide ($Al_2O_3$), Magnesium Oxide (MgO), and Silicon Dioxide ($SiO_2$) in accordance with certain embodiments.

FIG. 4 illustrates a ternary phase diagram for predicted wet etch rates for various combinations of Aluminum Oxide ($Al_2O_3$), Magnesium Oxide (MgO), and Hafnium Oxide ($HfO_2$) in accordance with certain embodiments. FIG. 5 illustrates a ternary phase diagram for predicted etch rates for various combinations of Aluminum Oxide ($Al_2O_3$), Magnesium Oxide (MgO), and Silicon Dioxide ($SiO_2$) in accordance with certain embodiments.

MgO-based alloy films have significantly improved dry etch selectivity compared to $Al_2O_3$, but suffer from extremely high wet etch rate. However, by precisely alloying MgO with $Al_2O_3$ and one or more low wet etch rate oxides (e.g., $HfO_2$ or $SiO_2$), the wet etch rate of the etch stop layer may be tuned to an acceptable wet etch rate while maintaining a low dry etch rate. In one embodiment, the composition of etch stop layer 108 comprises $Al_vMg_zHf_wO_y$, which has excellent dry etch stop capability (i.e., low dry etch rate) and a customizable wet etch rate (e.g., based on the ratio of the various elements). In another embodiment, the composition of etch stop layer 108 comprises $Al_vMg_zSi_xO_y$, which also has excellent dry etch stop capability and a customizable wet etch rate.

If the etch stop layer 108 does not have sufficient etch stop capability, the fabrication process may be plagued by random punch through of the etch stop layer. To mitigate this problem, some processes may utilize a separately patterned plug (e.g., a CVD tungsten fill) as an etch stop. This provides a highly etch-selective metal at the bottom of the NAND tier stack. However, various complications may arise. For example, complete exhumation of the plug material from the channel 110 may be difficult. Moreover, the exhume may result in re-deposition of tungsten on lower tier levels (resulting the formation of Tungsten Silicon Oxide on active cells and dead bits due to shorting). As another example, additional masking layers are needed to define the plug for a metal stop layer.

The addition of Hf or Si (e.g., via $HfO_2$ or $SiO_2$) to $Al_2O_3$ may change the wet etch rate of the etch stop layer, but has minimal impact on the dry etch selectivity of the etch stop layer. The addition of MgO to $Al_2O_3$ may result in a $Mg_zAl_vO_y$ film that has high dry etch stop capability, but very high wet etch rate (e.g., when HF is used as the wet etch material). The addition of a low wet etch rate oxide (such as $HfO_2$ or $SiO_2$) to a $Mg_zAl_vO_y$ film (e.g., $MgAl_2O_4$) may lower the wet etch rate of the composition, thus increasing the suitability of the composition for use in an etch stop layer. For example, $Al_vMg_zHf_wO_y$ may be a suitable composition for the etch stop layer 108, providing excellent dry etch stop capability and customizable wet etch rate. In addition, $Al_vMg_zHf_wO_y$ films are amorphous and smooth upon deposition (and the film may remain smooth after the RTP spike anneal indicating that the $Al_vMg_zHf_wO_y$ has not broken into its constituent parts) and etch uniformly.

In the diagram, the wet etch rate generally increases from the right side of the triangle to the left side of the triangle, with region 402 exhibiting the lowest wet etch rate and region 408 exhibiting the highest wet etch rate. In particular embodiments, region 406 and neighboring compositions yield the most favorable wet etch rates for a particular fabrication process (though novel embodiments disclosed herein are not limited thereto). In a particular embodiment, a composition of roughly 50% $HfO_2$+25% MgO+25% $Al_2O_3$ (demarked by the star) yields a particularly favorable combination of wet etch rate and dry etch stop capability.

In the diagram of FIG. 5, region 502 represents compositions in which the wet etch rate is predicted to be higher than desirable (at least for some fabrication processes), region 504 represents compositions in which the dry etch rate is predicted to be too low, and region 506 represents compositions in which the wet etch rate and the dry etch rate are predicted to be favorable (the optimal composition may be different for other fabrication processes). In particular embodiments, stoichiometric Cordierite ($Mg_2Al_4Si_5O_{18}$) or Pyrope ($Mg_3Al_2Si_3O_{12}$), which are naturally occurring minerals, may be used to form the etch stop layer 108. The star on FIG. 5 depicts the composition of Cordierite.

Figure 6:
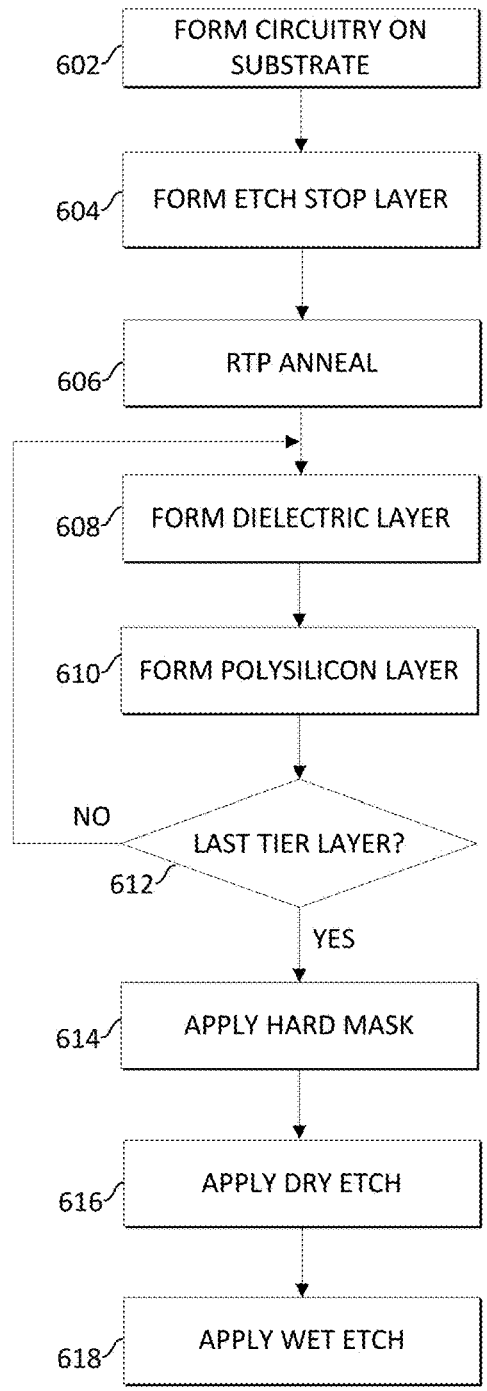
FIG. 6 illustrates an example flow for fabricating a memory device with an etch stop layer comprising Aluminum Oxide combined with one or more of Hafnium, Silicon, or Magnesium.

FIG. 6 illustrates an example flow for fabricating a memory device with an etch stop layer comprising Aluminum Oxide combined with one or more of Hafnium, Silicon, or Magnesium. At 602, various circuitry of a memory chip 100 or other semiconductor device is formed on a substrate. For example, pull up or pull down drivers, electrostatic protection circuitry, sense amplifiers, decoders, and/or other circuitry may be formed.

At 604, an etch stop layer 108 is formed. In a particular embodiment, the etch stop layer 108 may be formed by combining Aluminum Oxide with one or more of Hafnium, Silicon, or Magnesium (e.g., via combination with a respective oxide of Hafnium, Silicon, and/or Magnesium). The etch stop layer may be formed in any suitable manner. In a particular embodiment, a multi-cathode sputtering tool may sputter Aluminum Oxide via one cathode while utilizing another cathode to sputter Hafnium Oxide, Silicon Dioxide, or Magnesium Oxide onto the wafer (or multiple other cathodes may each sputter one of Hafnium Oxide, Silicon Dioxide, or Magnesium Oxide). In another embodiment, a sputtering tool may sputter a bulk target that comprises Aluminum Oxide pre-mixed with one or more of Aluminum, Magnesium, or Silicon. In yet another embodiment, any of Aluminum Oxide, Magnesium Oxide, Silicon Dioxide, and Hafnium Oxide may be premixed with one or more of the other compounds to form a bulk target and the bulk target may be deposited (e.g., sputtered) simultaneously with the deposition (e.g., via sputtering) of one or more of the other compounds.

The etch stop layer 108 may be formed using any suitable deposition techniques, such as physical vapor deposition (PVD), chemical vapor deposition (CVD), electrochemical deposition (ECD), molecular beam epitaxy (MBE), atomic layer deposition (ALD), thermal evaporation deposition, or other suitable deposition process.

At 606, an RTP spike anneal is performed. For example, the wafer may be quickly heated to a temperature that is over 1000° C. and then slowly cooled. The anneal may result in dopant activation within the wafer. In various embodiments, the anneal does not cause crystallization of the etch stop layer 108 (due to the etch stop layer having a higher crystallization temperature than the temperature of the anneal). In various embodiments, the anneal phase may occur at any suitable point in the flow. For example, if the etch stop layer 108 does not crystallize during the anneal, then it does not matter whether the anneal is performed before or after the deposition of the etch stop layer. In some embodiments, the anneal phase is not performed (thus the anneal phase is optional depending on the fabrication process used).

At 608 a dielectric layer of the tier is formed. The dielectric layer may be any suitable material formed in any suitable manner. In a particular embodiment, a thin layer of silicon dioxide is formed using CVD. At 610, a polysilicon layer of the tier is formed over (e.g., directly on top of) the dielectric layer. The polysilicon layer may be formed in any suitable manner. In a particular embodiment, a thin layer of polysilicon is formed using CVD. At 612, if the polysilicon layer is not the last layer of the tier, then the flow returns to 608 for the formation of additional layers of the tier.

At 614, a hard mask is applied. The hard mask may comprise apertures where channels are to be formed through the tier. At 616, a dry etch material is applied. The dry etching may be accomplished in any suitable manner. For example, dry etching may include application of reactive gases including one or more of fluorocarbons, oxygen, chlorine, boron trichloride, nitrogen, argon, helium, or other gases. In various embodiments, dry etching may involve physical dry etching (e.g., application of ion, electron, or photon beams), chemical dry etching, reactive-ion etching, or other suitable etching technique. The dry etch may result in removal of material previously disposed in the now formed channel 110. The dry etch may extend down to (and partially through) the etch stop layer 108. At 618, a wet etch material is applied. The wet etch may remove portions of the etch stop layer 108 from the channel 110 (these portions may have been displaced from the etch stop layer 108 during the dry etch). The wet etch material may comprise any one or more of hydrofluoric acid, nitric acid, water, ammonium fluoride, phosphoric acid, acetic acid, or other suitable wet etch material.

Figure 7:
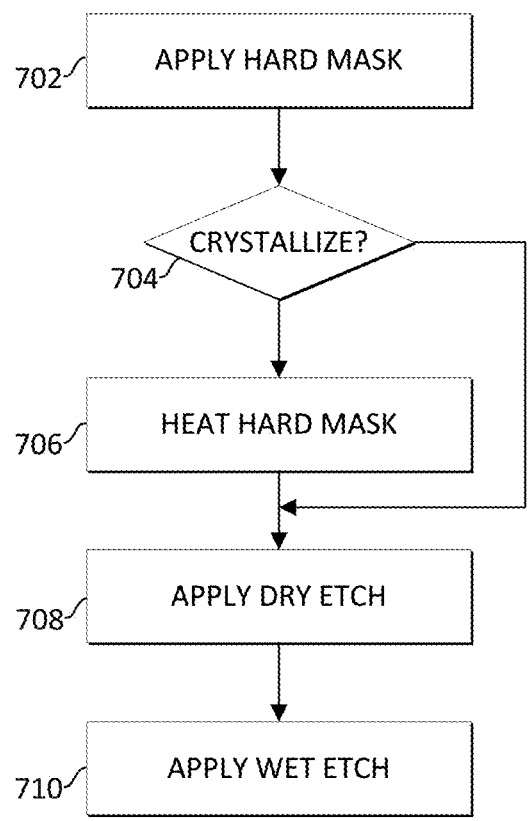
FIG. 7 illustrates an example flow for fabricating a memory device with a hard mask utilizing Magnesium Oxide (MgO) or Magnesium Aluminum Oxide ($MgAl_2O_4$) in accordance with certain embodiments.

FIG. 7 illustrates an example flow for fabricating a memory device using Magnesium Oxide (MgO) or Magnesium Aluminum Oxide (MgAl$_2$O$_4$) to create a hard mask film in accordance with certain embodiments. The high dry etch resistance of Magnesium Oxide and Magnesium Aluminum Oxide make these materials highly suitable for use in a hard mask layer. As described above, these materials have high wet etch rates (potentially rendering them unsuitable for use as etch stop layers in some fabrication processes, though they may be alloyed with other compounds to form suitable etch stop layers), which may allow them to be easily removed after being used as a mask.

CVD Carbon and doped Carbon films are currently struggling to meet very high aspect ratio (i.e., very high dry etch resistance) etch needs for 3D NAND. Moreover, high metal content hard masks (such as Wand W-doped Carbon) may cause twisting and etch block due to redisposition during dry etch.

In various embodiments, oxide mixtures comprising MgO or Mg$_z$Al$_y$O$_y$ may be used to form a hard mask with a low dry etch rate. MgO and Mg$_z$Al$_y$O$_y$ each have a high wet etch rate, but their wet etch rates are tunable via alloying with High-K oxides (e.g., SiO$_2$ and/or HfO$_2$) and/or by structural modification through crystallization. MgO and Mg$_z$Al$_y$O$_y$ also have low dry etch rates. Furthermore, in contrast to opaque Carbon hard masks, MgO and MgAlOx are both transparent, allowing direct alignment of masks using photolithography.

The amorphous structure of Magnesium Aluminum Oxide (e.g., MgAl$_2$O$_4$) has a very high wet etch rate. This has potential benefits when using the Magnesium Aluminum Oxide as a hard mask, such that it may be easily stripped using a wet etch after a dry etch is performed with a low risk of contamination in the channel. If the wet etch rate of the hard mask is too high, crystallization (e.g., during the anneal phase) can mitigate that factor (i.e., the wet etch rate may drop after crystallization). If crystallization is desired, high film stress may result. However, the high stress is tensile, and if the dry etch selectivity is significantly improved by using Magnesium Aluminum Oxide as a hard mask, the hard mask thickness may be greatly reduced, limiting the overall impact of wafer bow.

In various embodiments, the wet etch rate of a hard mask can be also tuned through alloying Magnesium Oxide or Magnesium Aluminum Oxide with HfO$_2$ and/or SiO$_2$. In a particular embodiment, an optimized composition range may be approximately 50% HfO$_2$+25% MgO+25% Al$_2$O$_3$, though any suitable ratios of HfO$_2$, Al$_2$O$_3$, and/or SiO$_2$ may be alloyed with MgO in various embodiments to form a hard mask layer. In various embodiments, the hard mask may comprise Cordierite (Mg$_2$Al$_4$Si$_5$O$_{18}$) or other Magnesium Aluminum Silicon Oxide. In various embodiments, stress, wet etch rate, and/or roughness of the hard mask layer can be tuned via structural modification (e.g., by crystallizing the hard mask through application of heat, e.g., during an annealing phase).

In the flow of FIG. 7, a hard mask is formed at 702. In various embodiments the hard mask may be formed using MgO, Mg$_z$Al$_y$O$_y$, or a combination of MgO or Mg$_z$Al$_y$O$_y$ with one or more of Hafnium or Silicon (e.g., by combining with Hafnium Oxide or Silicon Dioxide). The hard mask layer may be formed in any suitable manner. In a particular embodiment, a multi-cathode sputtering tool may sputter MgO via one cathode while utilizing another cathode to sputter Aluminum Oxide, Silicon Dioxide, or Hafnium Oxide onto the wafer (or multiple other cathodes may each sputter one of Aluminum Oxide, Silicon Dioxide, or Hafnium Oxide). In another embodiment, a sputtering tool may sputter a bulk target that comprises Magnesium Oxide pre-mixed with one or more of Aluminum, Hafnium, or Silicon (e.g., via their respective oxides or by other means). In yet another embodiment, any of Magnesium Oxide, Aluminum Oxide, Silicon Dioxide, and Hafnium Oxide may be premixed with one or more of the other compounds to form a bulk target and the bulk target may be deposited (e.g., sputtered) simultaneously with the deposition (e.g., via sputtering) of one or more of the other compounds.

At 704, if the hard mask is to be crystallized (e.g., to decrease the wet etch rate of the hard mask), heat is applied at 706. In a particular embodiment, this heat may be applied as part of an RTP spike anneal process used to activate dopants in the wafer. In some embodiments, the crystallize operation is omitted.

At 708, a dry etch material is applied to form any suitable channels through the tier (e.g., via apertures in the hard mask). For example, channels 110 previous described may be formed. As another example, the hard mask and dry etch may be used to form vias through the tier to one or more metal layers below the tier. As another example, the hard mask and dry etch may be used to form a portion of a staircase channel (e.g., during fabrication, a plurality of hard masks may be applied and etches of various depths may be performed in order to provide individual connections (e.g., by vias) from above the tier to each layer of polysilicon 102 in order to connect to memory cells in the respective polysilicon layers).

The flows described in FIGS. 6 and 7 are merely representative of operations that may occur in particular embodiments. In other embodiments, additional operations may be performed in the flows (e.g., the various memory cells of the array may be formed). Various embodiments of the present disclosure contemplate any suitable signaling mechanisms for accomplishing the functions described herein. Some of the operations illustrated in FIGS. 6 and 7 may be repeated, combined, modified or deleted where appropriate. Additionally, operations may be performed in any suitable order without departing from the scope of particular embodiments.

Figure 8:
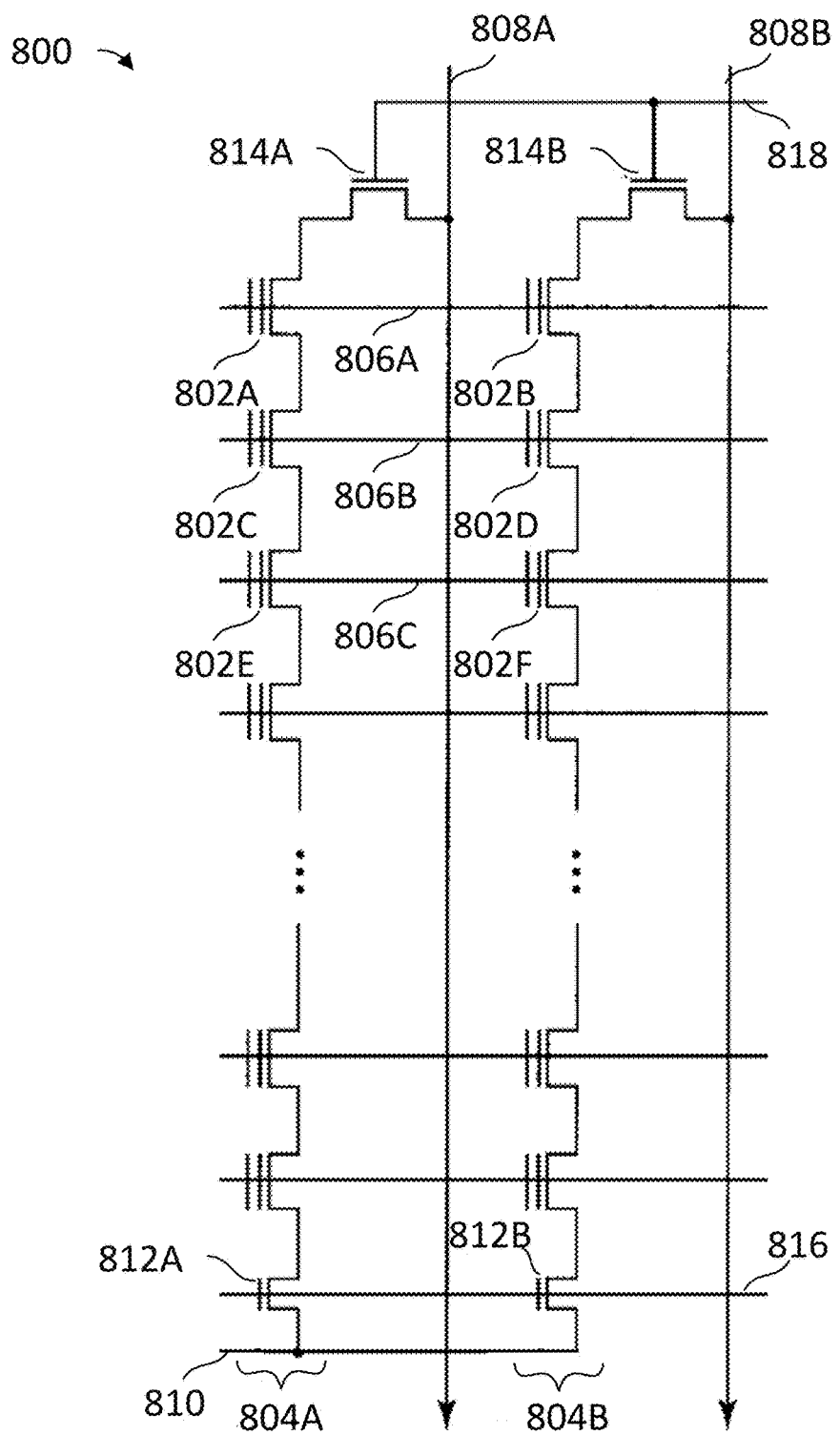
FIG. 8 illustrates an example portion of a NAND flash memory array in accordance with certain embodiments.

FIG. 8 illustrates an example portion of a NAND flash memory array 800 in accordance with certain embodiments. In various embodiments, a memory chip 100 may comprise one or more NAND flash memory arrays. NAND flash memory array 800 may comprise a plurality of non-volatile memory cells 802 arranged in columns such as series strings 804. In particular embodiments the cells 802 of the NAND flash memory arrays may be formed in the tier of polysilicon layers and dielectric layers. In various embodiments, each memory cell 802 may comprise a transistor with a floating gate that stores charge indicative of one or more bit values stored by the memory cell 802. Other embodiments may include memory cells utilizing replacement gate or charge trap technology. In the series strings 804, the drains of the cells 802 are each (with the exception of the top cell) coupled to a source of another cell 802.

The array 800 also includes wordlines 806 (e.g., 806A-806C). A wordline 806 may span across multiple series strings 804 (e.g., a wordline may be coupled to a memory cell 802 of each series string 804) and is connected to the control gates of the memory cells 802 of a row of the array 800 and used to bias the control gates of the memory cells 802 of the row. The bitlines 808 (e.g., 808A, 808B) are each coupled to a respective series string 804 by a respective drain select gate 814 (e.g., 814A, 814B). The bitlines may also be coupled to sensing circuitry that detects the state of each cell by sensing voltage or current of each sensed bitline 808.

Each series string 804 of memory cells is coupled to a source line 810 by a source select gate 812 and to an individual bitline 808 by a drain select gate 814. The source select gates 812 are controlled by a source select gate control line 816 and the drain select gates 814 are controlled by a drain select gate control line 818. In other embodiments, multiple drain select gate control lines 818 may be used (such that one drain select gate control line may control a subset of the drain select gates 814, another drain select gate control line may control a different subset of the drain select gates 814, and so on). The source line 810 may be coupled to a fixed bias voltage (e.g., VSRC). In various embodiments, VSRC may be set to ground or positively biased (e.g., between 0 and ~1.5V).

Figure 9:
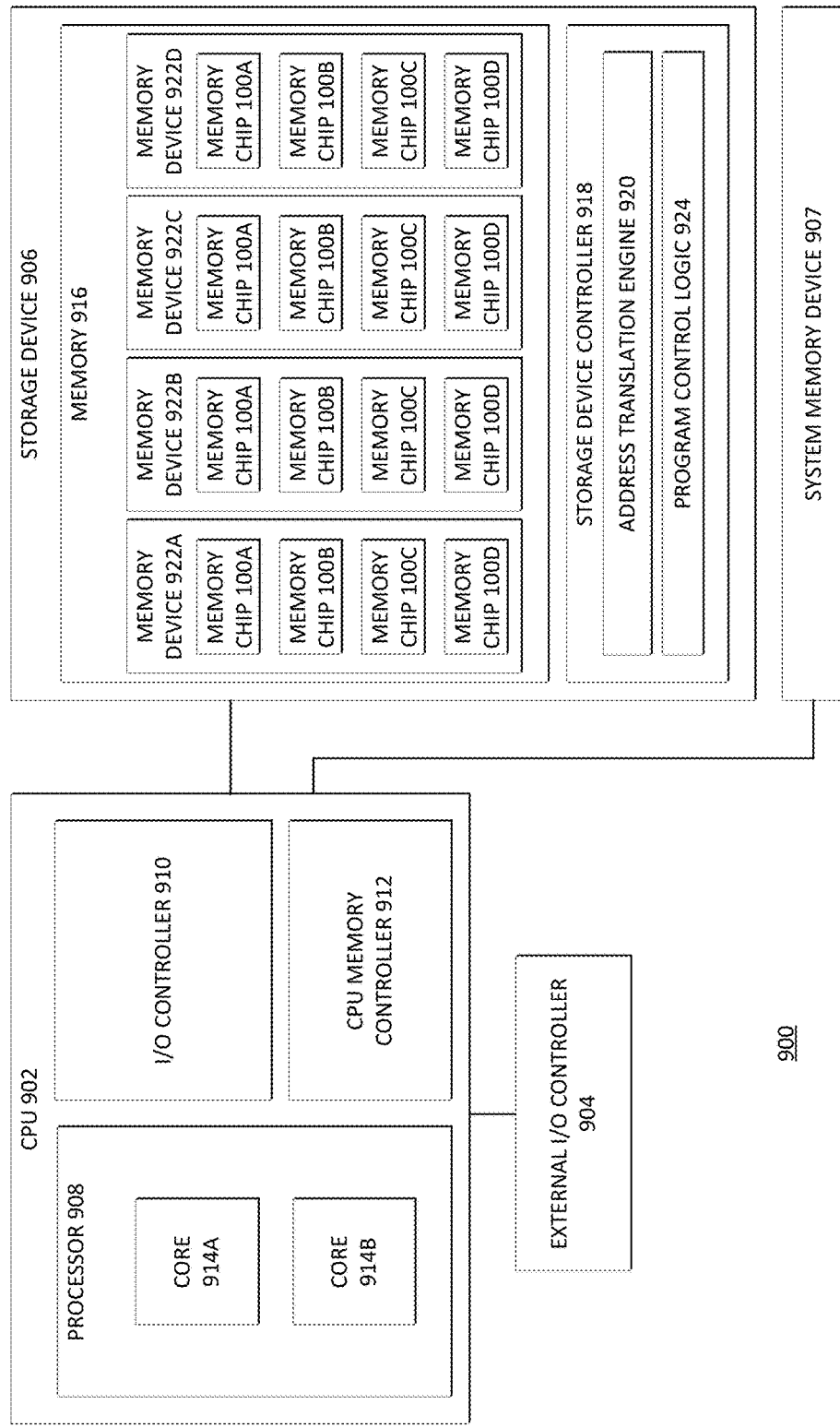
FIG. 9 illustrates a block diagram of components of a computer system in accordance with certain embodiments.

FIG. 9 illustrates a block diagram of components of a computer system 900 in accordance with certain embodiments. System 900 includes a central processing unit (CPU) 902 coupled to an external input/output (I/O) controller 904, storage device 906, and system memory device 907. During operation, data may be transferred between storage device 906 or system memory device 907 and the CPU 902. In various embodiments, particular data operations (e.g., erase, program, and read operations) involving a storage device 906 or system memory device 907 may be managed by an operating system or other software application executed by processor 908.

In various embodiments, a storage device 906 comprises NAND flash memory (herein a storage device comprising NAND flash memory is referred to as a NAND flash storage device). In some embodiments, storage device 906 may be a solid state drive; a memory card; a Universal Serial Bus (USB) flash drive; or memory integrated within a device such as a smartphone, camera, media player, or other computing device. In general, storage devices with NAND flash memory are classified by the number of bits stored by each cell of the memory. For example, a single-level cell (SLC) memory has cells that each store one bit of data, a multi-level cell (MLC) memory has cells that each store two bits of data, a tri-level cell (TLC) memory has cells that each store three bits of data, and a quad-level cell (QLC) memory has cells that each store four bits of data, though some memories may utilize multiple encoding schemes (e.g., MLC and TLC) on the same array or on different arrays of the same device.

A storage device 906 may include any number of memories 916 and each memory 916 may include any number of memory devices 922 (e.g., 922A-D). In a particular embodiment, a memory device 922 may be or comprise a semiconductor package with one or more memory chips 100 (e.g., memory chips 100A-D). In the embodiment depicted, memory 916 includes memory devices 922A-D (while specific references herein may be made to memory device 922A, the other memory devices may have any suitable characteristics of memory device 922A).

CPU 902 comprises a processor 908, such as a microprocessor, an embedded processor, a digital signal processor (DSP), a network processor, a handheld processor, an application processor, a co-processor, a system on a chip (SOC), or other device to execute code (i.e., software instructions). Processor 908, in the depicted embodiment, includes two processing elements (cores 914A and 914B in the depicted embodiment), which may include asymmetric processing elements or symmetric processing elements. However, a processor may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core 914 may refer to logic located on an integrated circuit capable of maintaining an independent architectural state, wherein each independently maintained architectural state is associated with at least some dedicated execution resources. A hardware thread may refer to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

In various embodiments, the processing elements may also include one or more arithmetic logic units (ALUs), floating point units (FPUs), caches, instruction pipelines, interrupt handling hardware, registers, or other hardware to facilitate the operations of the processing elements.

I/O controller 910 is an integrated I/O controller that includes logic for communicating data between CPU 902 and I/O devices, which may refer to any suitable devices capable of transferring data to and/or receiving data from an electronic system, such as CPU 902. For example, an I/O device may comprise an audio/video (A/V) device controller such as a graphics accelerator or audio controller; a data storage device controller, such as a flash memory device, magnetic storage disk, or optical storage disk controller; a wireless transceiver; a network processor; a network interface controller; or a controller for another input devices such as a monitor, printer, mouse, keyboard, or scanner; or other suitable device. In a particular embodiment, an I/O device may comprise a storage device 906 that may be coupled to the CPU 902 through I/O controller 910.

An I/O device may communicate with the I/O controller 910 of the CPU 902 using any suitable signaling protocol, such as peripheral component interconnect (PCI), PCI Express (PCIe), Universal Serial Bus (USB), Serial Attached SCSI (SAS), Serial ATA (SATA), Fibre Channel (FC), IEEE 802.3, IEEE 802.11, or other current or future signaling protocol. In particular embodiments, I/O controller 910 and the underlying I/O device may communicate data and commands in accordance with a logical device interface specification such as Non-Volatile Memory Express (NVMe) (e.g., as described by one or more of the specifications available at www.nvmexpress.org/specifications/) or Advanced Host Controller Interface (AHCI) (e.g., as described by one or more AHCI specifications such as Serial ATA AHCI: Specification, Rev. 1.3.1 available at http://www.intel.com/content/www/us/en/io/serial-ata/serial-ata-ahci-spec-rev1-3-1.html). In various embodiments, I/O devices coupled to the I/O controller may be located off-chip (i.e., not on the same chip as CPU 902) or may be integrated on the same chip as the CPU 902.

CPU memory controller 912 is an integrated memory controller that includes logic to control the flow of data going to and from one or more system memory devices 907. CPU memory controller 912 may include logic operable to read from a system memory device 907, write to a system memory device 907, or to request other operations from a system memory device 907. In various embodiments, CPU memory controller 912 may receive write requests from cores 914 and/or I/O controller 910 and may provide data specified in these requests to a system memory device 907 for storage therein. CPU memory controller 912 may also read data from a system memory device 907 and provide the read data to I/O controller 910 or a core 914. During operation, CPU memory controller 912 may issue commands including one or more addresses of the system memory device 907 in order to read data from or write data to memory (or to perform other operations). In some embodiments, CPU memory controller 912 may be implemented on the same chip as CPU 902, whereas in other embodiments, CPU memory controller 912 may be implemented on a different chip than that of CPU 902. I/O controller 910 may perform similar operations with respect to one or more storage devices 906.

The CPU 902 may also be coupled to one or more other I/O devices through external I/O controller 904. In a particular embodiment, external I/O controller 904 may couple a storage device 906 to the CPU 902. External I/O controller 904 may include logic to manage the flow of data between one or more CPUs 902 and I/O devices. In particular embodiments, external I/O controller 904 is located on a motherboard along with the CPU 902. The external I/O controller 904 may exchange information with components of CPU 902 using point-to-point or other interfaces.

A system memory device 907 may store any suitable data, such as data used by processor 908 to provide the functionality of computer system 900. For example, data associated with programs that are executed or files accessed by cores 914 may be stored in system memory device 907. Thus, a system memory device 907 may include a system memory that stores data and/or sequences of instructions that are executed or otherwise used by the cores 914. In various embodiments, a system memory device 907 may store persistent data (e.g., a user's files or instruction sequences) that remains stored even after power to the system memory device 907 is removed. A system memory device 907 may be dedicated to a particular CPU 902 or shared with other devices (e.g., one or more other processors or other device) of computer system 900.

In various embodiments, a system memory device 907 may include a memory comprising any number of memory arrays, a memory device controller, and other supporting logic (not shown). A memory array may include non-volatile memory and/or volatile memory. Non-volatile memory is a storage medium that does not require power to maintain the state of data stored by the medium. Nonlimiting examples of nonvolatile memory may include any or a combination of: solid state memory (such as planar or 3D NAND flash memory or NOR flash memory), 3D crosspoint memory, memory devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), and magnetic storage memory. In some embodiments, 3D crosspoint memory may comprise a transistor-less stackable cross point architecture in which memory cells sit at the intersection of words lines and bit lines and are individually addressable and in which bit storage is based on a change in bulk resistance. Volatile memory is a storage medium that requires power to maintain the state of data stored by the medium. Examples of volatile memory may include various types of random access memory (RAM), such as dynamic random access memory (DRAM) or static random access memory (SRAM). One particular type of DRAM that may be used in a memory array is synchronous dynamic random access memory (SDRAM). In some embodiments, any portion of memory 907 that is volatile memory can comply with JEDEC standards including but not limited to Double Data Rate (DDR) standards, e.g., DDR3, 4, and 5, or Low Power DDR4 (LPDDR4) as well as emerging standards.

A storage device 906 may store any suitable data, such as data used by processor 908 to provide functionality of computer system 900. For example, data associated with programs that are executed or files accessed by cores 914A and 914B may be stored in storage device 906. Thus, in some embodiments, a storage device 906 may store data and/or sequences of instructions that are executed or otherwise executed by the cores 914A and 914B. In various embodiments, a storage device 906 may store persistent data (e.g., a user's files or software application code) that remains stored even after power to the storage device 906 is removed. A storage device 906 may be dedicated to CPU 902 or shared with other devices (e.g., another CPU or other device) of computer system 900.

In the embodiment depicted, storage device 906 includes a storage device controller 918 and a memory 916 comprising four memory devices 922A-D operable to store data, however, a storage device may include any suitable number of memory devices. A memory device 922A includes a plurality of memory cells that are each operable to store one or more bits. The cells of a memory device 922A may be arranged in any suitable fashion, such as in rows (e.g., wordlines) and columns (e.g., bitlines), three dimensional structures, and/or other manner. In various embodiments, the cells may be logically grouped into banks, blocks, sub-blocks, wordlines, pages, frames, bytes, or other suitable groups. In various embodiments, a memory device 922A comprises one or more NAND flash memory arrays.

A memory device 922A may include any of the volatile or non-volatile memories listed above or other suitable memory. In particular embodiments, memory device 922A includes non-volatile memory, such as planar or 3D NAND flash memory. In particular embodiments, a memory device 922A with non-volatile memory may comply with one or more standards for non-volatile memory promulgated by the Joint Electron Device Engineering Council (JEDEC), such as JESD218, JESD219, JESD220-1, JESD220C, JESD223C, JESD223-1, or other suitable standard (the JEDEC standards cited herein are available at www.jedec.org). In particular embodiments, the storage device comprises NAND flash memory that complies with one or more portions of a standard promulgated by JEDEC for SDRAM memory, such as JESD79F for Double Data Rate (DDR) SDRAM, JESD79-2F for DDR2 SDRAM, JESD79-3F for DDR3 SDRAM, or JESD79-4A for DDR4 SDRAM (these standards are available at www.jedec.org). Such standards (and similar standards) may be referred to as DDR-based standards and communication interfaces of the storage devices that implement such standards may be referred to as DDR-based interfaces. For example, a storage device 906 comprising NAND flash memory may receive a command that has a format compliant with a DDR-based standard and may translate the command into one or more commands that are compatible with NAND flash memory of the storage device 906. Similarly, the storage device 906 may format results from operations performed on the NAND flash memory into a format that is compliant with a DDR-based standard before transmitting the results to the CPU 902.

In a particular embodiment, a memory device 922 is a semiconductor package. In various embodiments, a semiconductor package may comprise a casing comprising one or more semiconductor dies (also referred to as chips) (e.g., memory chips 100A-D). A package may also comprise contact pins or leads used to connect to external circuits. However, a package is merely one example form a memory device 922 may take as a memory device may be any suitable arrangement of one or more memory arrays and associated logic in any suitable physical arrangement. For example, although a single physical package may include a single memory device 922, multiple memory devices 922 could be resident on a single package or a memory 922 could be spread across multiple packages.

A memory 916 may be embodied in one or more different physical mediums, such as a circuit board, die, disk drive, other medium, or any combination of thereof (or combination with one or more packages). In a particular embodiment, memory 916 comprises a circuit board coupled to a plurality of memory devices 922 that each comprise a semiconductor package.

Storage device 906 may comprise any suitable type of memory and is not limited to a particular speed, technology, or form factor of memory in various embodiments. For example, a storage device 906 may be a disk drive (such as a solid state drive), a flash drive, memory integrated with a computing device (e.g., memory integrated on a circuit board of the computing device), a memory module (e.g., a dual in-line memory module) that may be inserted in a memory socket, or other type of storage device. Moreover, computer system 900 may include multiple different types of storage devices. Storage device 906 may include any suitable interface to communicate with CPU memory controller 912 or I/O controller 910 using any suitable communication protocol such as a DDR-based protocol, PCI, PCIe, USB, SAS, SATA, FC, System Management Bus (SMBus), or other suitable protocol. A storage device 906 may also include a communication interface to communicate with CPU memory controller 912 or I/O controller 910 in accordance with any suitable logical device interface specification such as NVMe, AHCI, or other suitable specification. In particular embodiments, storage device 906 may comprise multiple communication interfaces that each communicate using a separate protocol with CPU memory controller 912 and/or I/O controller 910.

Storage device controller 918 may include logic to receive requests from CPU 902 (e.g., via CPU memory controller 912 or I/O controller 910), cause the requests to be carried out with respect to a memory 916 (or memory devices(s) thereof), and provide data associated with the requests to CPU 902 (e.g., via CPU memory controller 912 or I/O controller 910). Controller 918 may also be operable to detect and/or correct errors encountered during memory operation. In an embodiment, controller 918 also tracks the number of times particular cells (or logical groupings of cells) have been written to in order to perform wear leveling and/or to detect when cells are nearing an estimated number of times they may be reliably written to. In performing wear leveling, the storage device controller 918 may evenly spread out write operations among blocks of the memory of a memory 916 such that particular blocks are not written to more than other blocks. In various embodiments, controller 918 may also monitor various characteristics of the storage device 906 such as the temperature or voltage and report associated statistics to the CPU 902. Storage device controller 918 can be implemented on the same circuit board or device as a memory 916 or on a different circuit board, or device. For example, in some environments, storage device controller 918 may be a centralized storage controller that manages memory operations for multiple different memories 916 (which may each be of the same type of memory or may be of different types) of computer system 900 (and thus may provide storage device controller functionality described herein to any of the memories to which it is coupled).

In various embodiments, the storage device 906 also includes an address translation engine 920. In the depicted embodiment, the address translation engine 920 is shown as part of the storage device controller 918, although in various embodiments, the address translation engine 920 may be separate from the storage device controller 918 and communicably coupled to the storage device controller 918. In various embodiments, the address translation engine 920 may be integrated on the same chip or package as the storage device controller 918 or on a different chip or package.

In various embodiments, address translation engine 920 may include logic to store and update a mapping between a logical address space (e.g., an address space visible to a host computing device coupled to the storage device 906) and the physical address space of the memory 916 of the storage device 906 (which may or may not be exposed to the host computing device). The logical address space may expose a plurality of logical groups of data which are physically stored on corresponding physical groups of memory addressable through the physical address space of the storage device 906. A physical address of the physical address space may comprise any suitable information identifying a physical memory location (e.g., a location within a memory array of a memory 916) of the storage device 906, such as an identifier of the memory 916 on which the physical memory location is located, an identifier of the memory device 922A on which the physical memory location is located, one or more pages of the physical memory location, one or more subblocks of the physical memory location, one or more wordlines of the physical memory location, one or more bitlines of the physical memory location, or other suitable identifiers or encodings thereof.

In various embodiments, the storage device 906 also includes program control logic 924 which is operable to control the programming sequence performed when data is written to a memory 916 or the read sequence performed when data is read from a memory 916. In various embodiments, program control logic 924 may provide the various voltages (or information indicating which voltages should be provided) that are applied to one or more memory cells, word lines, bitlines, and/or other portions of a memory array during the programming and/or reading of data, perform error correction, and perform other suitable functions.

In various embodiments, the program control logic 924 may be integrated on the same chip as the storage device controller 918 or on a different chip. In the depicted embodiment, the program control logic 924 is shown as part of the storage device controller 918, although in various embodiments, all or a portion of the program control logic 924 may be separate from the storage device controller 918 and communicably coupled to the storage device controller 918. For example, all or a portion of the program control logic 924 may be located on the same package or chip as a memory 916 and/or memory devices 922A-D.

In some embodiments, all or some of the elements of system 900 are resident on (or coupled to) the same circuit board (e.g., a motherboard). In various embodiments, any suitable partitioning between the elements may exist. For example, the elements depicted in CPU 902 may be located on a single die (i.e., on-chip) or package or any of the elements of CPU 902 may be located off-chip or off-package. Similarly, the elements depicted in storage device 906 may be located on a single chip or on multiple chips. In various embodiments a storage device 906 and a host computing device (e.g., CPU 902) may be located on the same circuit board or on the same device and in other embodiments the storage device 906 and the host computing device may be located on different circuit boards or devices.

The components of system 900 may be coupled together in any suitable manner. For example, a bus may couple any of the components together. A bus may include any known interconnect, such as a multi-drop bus, a mesh interconnect, a ring interconnect, a point-to-point interconnect, a serial interconnect, a parallel bus, a coherent (e.g. cache coherent) bus, a layered protocol architecture, a differential bus, and a Gunning transceiver logic (GTL) bus. In various embodiments an integrated I/O subsystem includes point-to-point multiplexing logic between various components of system 900, such as cores 914, one or more CPU memory controllers 912, I/O controller 910, integrated I/O devices, direct memory access (DMA) logic (not shown), etc. In various embodiments, components of computer system 900 may be coupled together through one or more networks comprising any number of intervening network nodes, such as routers, switches, or other computing devices. For example, a host computing device (e.g., CPU 902) and the storage device 906 may be communicably coupled through a network.

Although not depicted, system 900 may use a battery and/or power supply outlet connector and associated system to receive power, a display to output data provided by CPU 902, or a network interface allowing the CPU 902 to communicate over a network. In various embodiments, the battery, power supply outlet connector, display, and/or network interface may be communicatively coupled to CPU 902. Other sources of power can be used such as renewable energy (e.g., solar power or motion based power).

FIG. 10 illustrates a horizontal cross section of a portion of a memory chip 100 with a discontinuous etch stop layer 120 (comprising portions 120A and 120B) in accordance with certain embodiments. Etch stop layer 120 may have any one or more of the characteristics of etch stop layer 108 described above (e.g., any of the compositions described above may be used to form etch stop layer 120). In a particular embodiment, prior to forming the tier, a plurality of holes may be formed in a dielectric layer 118 over the substrate. The dielectric layer 118 and holes therein may be formed in any suitable manner (e.g., via application of one or more masks and/or etches or via any other suitable means). Each hole is then filled with the etch stop material to form a portion (e.g., 120A or 120B) of the etch stop layer. The surface over the dielectric layer 118 and etch stop layer 120 may then be planarized (e.g., using Chemical Mechanical Planarization) and the tier is formed over the resulting surface. In a particular embodiment, the dry etch used to form channels 110 may be stopped by the etch stop portions (e.g., 120A and 120B) and a wet etch may remove residual etch stop film from the channels 110. In such embodiments, the upper limit on the wet etch rate requirement may be relaxed if the dielectric layer 118 has a high wet etch selectivity compared to the etch stop material.

Although various embodiments described herein focus on etch stop layers and hard masks used in a memory device, the teachings of the present disclosure may be applied to etch stop layers or hard masks in any suitable semiconductor device. For example, a hard mask layer or etch stop layer may be used in conjunction with an etch performed through any suitable layers (comprising any suitable material) of a semiconductor device. Moreover, although various composition regions have been depicted as being "optimal" or "desirable", novel embodiments described herein may include compositions within any of the depicted regions of the ternary phase diagrams. Moreover, various embodiments disclose etch stop layers or hard masks comprised of particular compounds (e.g., Aluminum Hafnium Oxide, Magnesium Aluminum Oxide, etc.). Such embodiments, contemplate the particular compound composing any suitable portion of an etch stop layer or hard mask. For example, although the etch stop layer or hard mask may comprise a majority of the particular compound, the etch stop layer or hard mask may also comprise any suitable amount of other compounds (e.g., impurities or other compounds described herein). In various embodiments, an etch stop layer or hard mask may be comprised substantially of any of the compounds listed herein (e.g., 99% or more of the etch stop layer or hard mask may be the particular compound).

A design may go through various stages, from creation to simulation to fabrication. Data representing a design may represent the design in a number of manners. First, as is useful in simulations, the hardware may be represented using a hardware description language (HDL) or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In some implementations, such data may be stored in a database file format such as Graphic Data System II (GDS II), Open Artwork System Interchange Standard (OASIS), or similar format.

In some implementations, software based hardware models, and HDL and other functional description language objects can include register transfer language (RTL) files, among other examples. Such objects can be machine-parsable such that a design tool can accept the HDL object (or model), parse the HDL object for attributes of the described hardware, and determine a physical circuit and/or on-chip layout from the object. The output of the design tool can be used to manufacture the physical device. For instance, a design tool can determine configurations of various hardware and/or firmware elements from the HDL object, such as bus widths, registers (including sizes and types), memory blocks, physical link paths, fabric topologies, among other attributes that would be implemented in order to realize the system modeled in the HDL object. Design tools can include tools for determining the topology and fabric configurations of system on chip (SoC) and other hardware device. In some instances, the HDL object can be used as the basis for developing models and design files that can be used by manufacturing equipment to manufacture the described hardware. Indeed, an HDL object itself can be provided as an input to manufacturing system software to cause the manufacture of the described hardware.

In any representation of the design, the data representing the design may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present disclosure.

In various embodiments, a medium storing a representation of the design may be provided to a manufacturing system (e.g., a semiconductor manufacturing system capable of manufacturing an integrated circuit and/or related components). The design representation may instruct the system to manufacture a device capable of performing any combination of the functions described above. For example, the design representation may instruct the system regarding which components to manufacture, how the components should be coupled together, where the components should be placed on the device, and/or regarding other suitable specifications regarding the device to be manufactured.

Thus, one or more aspects of at least one embodiment may be implemented by representative instructions stored on a machine-readable medium which represents various logic within the processor, which when read by a machine causes the machine to fabricate logic to perform the techniques described herein. Such representations, often referred to as "IP cores" may be stored on a non-transitory tangible machine readable medium and supplied to various customers or manufacturing facilities to load into the fabrication machines that manufacture the logic or processor.

Embodiments of the mechanisms disclosed herein may be implemented in hardware, software, firmware, or a combination of such implementation approaches. Embodiments of the disclosure may be implemented as computer programs or program code executing on programmable systems comprising at least one processor, a storage system (including volatile and non-volatile memory and/or storage elements), at least one input device, and at least one output device.

Program code may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In various embodiments, the language may be a compiled or interpreted language.

The embodiments of methods, hardware, software, firmware or code set forth above may be implemented via instructions or code stored on a machine-accessible, machine readable, computer accessible, or computer readable medium which are executable (or otherwise accessible) by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices;

electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information therefrom.

Instructions used to program logic to perform embodiments of the disclosure may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible, machine-readable medium suitable for storing or transmitting electronic instructions or information in a form readable by a machine (e.g., a computer).

Logic may be used to implement any of the flows (e.g., the flows of FIG. 6 or FIG. 7) or functionality of any of the various components depicted throughout the figures, such as CPU 902, storage device 906, external I/O controller 904, system memory device 907, one or more machines to manufacture chip 100, any subcomponent of these, or other component described herein. "Logic" may refer to hardware, firmware, software and/or combinations of each to perform one or more functions. As an example, logic may include hardware, such as a micro-controller or processor, associated with a non-transitory medium to store code adapted to be executed by the micro-controller or processor. Therefore, reference to logic, in one embodiment, refers to the hardware, which is specifically configured to recognize and/or execute the code to be held on a non-transitory medium. Furthermore, in another embodiment, use of logic refers to the non-transitory medium including the code, which is specifically adapted to be executed by the microcontroller to perform predetermined operations. And as can be inferred, in yet another embodiment, the term logic (in this example) may refer to the combination of the hardware and the non-transitory medium. In various embodiments, logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. Logic may include one or more gates or other circuit components, which may be implemented by, e.g., transistors. In some embodiments, logic may also be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Often, logic boundaries that are illustrated as separate commonly vary and potentially overlap. For example, first and second logic may share hardware, software, firmware, or a combination thereof, while potentially retaining some independent hardware, software, or firmware.

Use of the phrase 'to' or 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example, the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

In at least one embodiment, an apparatus comprising an etch stop layer comprising Aluminum Oxide and one or more of Hafnium, Silicon, or Magnesium; and a channel formed through one or more layers deposited over the etch stop layer, the channel extending to the etch stop layer.

In an embodiment, the etch stop layer comprises Aluminum Hafnium Oxide. In an embodiment, the etch stop layer comprises Aluminum Hafnium Silicon Oxide. In an embodiment, the etch stop layer comprises Aluminum Magnesium Hafnium Oxide. In an embodiment, the etch stop layer comprises Aluminum Magnesium Silicon Oxide. In an embodiment, the apparatus further comprises a hard mask comprising Magnesium Oxide. In an embodiment, the hard mask further comprises one or more of Aluminum, Silicon, or Hafnium. In an embodiment, the etch stop layer has a crystallization temperature that is higher than 1000 degrees Celsius. In an embodiment, the etch stop layer has a dry etch rate that is lower than a dry etch rate of $Al_2O_3$. In an embodiment, the apparatus comprises a 3D NAND memory device. In an embodiment, the etch stop layer is a blanket etch stop layer deposited over the entire surface of a wafer. In an embodiment, the etch stop layer comprises a plurality of etch stop portions formed in holes of a dielectric layer formed on a wafer.

In at least one embodiment, a method comprises forming an etch stop layer comprising Aluminum Oxide and one or more of Hafnium, Silicon, or Magnesium; depositing a plurality of layers over the etch stop layer; and forming a channel through at least some of the plurality of layers, the channel extending to the etch stop layer.

In an embodiment, the etch stop layer comprises Aluminum Hafnium Oxide. In an embodiment, the etch stop layer comprises Aluminum Hafnium Silicon Oxide. In an embodiment, the etch stop layer comprises Aluminum Magnesium Hafnium Oxide. In an embodiment, the etch stop layer comprises Aluminum Magnesium Silicon Oxide. In an embodiment, the method further comprises forming a hard mask comprising Magnesium Oxide. In an embodiment, the hard mask further comprises one or more of Aluminum, Silicon, or Hafnium. In an embodiment, the etch stop layer has a crystallization temperature that is higher than 1000 degrees Celsius. In an embodiment, the etch stop layer has a dry etch rate that is lower than a dry etch rate of $Al_2O_3$. In an embodiment, at least one of the plurality of layers comprise a plurality of NAND memory cells. In an embodiment, forming the etch stop layer comprises simultaneously sputtering Aluminum Oxide using a first cathode of a sputtering tool and sputtering one or more of Hafnium Oxide, Silicon Dioxide, or Magnesium Oxide using a second cathode of the sputtering tool. In an embodiment, forming the etch stop layer comprises sputtering a bulk target onto a wafer, the bulk target comprising a combination of Aluminum Oxide and one or more of Hafnium, Silicon, or Magnesium.

In at least one embodiment, a system comprises a semiconductor package comprising a first memory chip, the first memory chip comprising a tier comprising alternating first and second layers, wherein the first layers comprise a first conductive material and the second layers comprise a first dielectric material; an etch stop layer comprising Aluminum Oxide and one or more of Hafnium, Silicon, or Magnesium; and a channel formed through the tier, the channel extending to the etch stop layer.

In an embodiment, the system further comprises a processor coupled to the semiconductor package. In an embodiment, the system further comprises one or more of a battery communicatively coupled to the processor, a display communicatively coupled to the processor, or a network interface communicatively coupled to the processor. In an embodiment, the etch stop layer comprises Aluminum Hafnium Silicon Oxide. In an embodiment, the etch stop layer comprises Aluminum Magnesium Hafnium Oxide.

In at least one embodiment, a system comprises means for forming an etch stop layer comprising Aluminum Oxide and one or more of Hafnium, Silicon, or Magnesium; means for depositing a plurality of layers over the etch stop layer; and means for forming a channel through at least some of the plurality of layers, the channel extending to the etch stop layer.

In an embodiment, forming the etch stop layer comprises simultaneously sputtering Aluminum Oxide using a first cathode of a sputtering tool and sputtering one or more of Hafnium Oxide, Silicon Dioxide, or Magnesium Oxide using a second cathode of the sputtering tool. In an embodiment, forming the etch stop layer comprises sputtering a bulk target onto a wafer, the bulk target comprising a combination of Aluminum Oxide and one or more of Hafnium, Silicon, or Magnesium. In an embodiment, the system further comprises means for forming a hard mask over the plurality of layers, the hard mask comprising Magnesium Oxide. In an embodiment, the hard mask further comprises one or more of Aluminum, Silicon, or Hafnium.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
an etch stop layer disposed beneath a bottom insulating layer of a tier comprising alternating insulating and conductive layers forming at least one memory array, the etch stop layer comprising Aluminum Oxide and one or more of Hafnium, Silicon, or Magnesium; and
a channel formed through the alternating insulating and conductive layers, the alternating insulating and conductive layers deposited over the etch stop layer, the channel extending to the etch stop layer.

2. The apparatus of claim 1, wherein the etch stop layer comprises Aluminum Hafnium Oxide.

3. The apparatus of claim 1, wherein the etch stop layer comprises Aluminum Hafnium Silicon Oxide.

4. The apparatus of claim 1, wherein the etch stop layer comprises Aluminum Magnesium Hafnium Oxide.

5. The apparatus of claim 1, wherein the etch stop layer comprises Aluminum Magnesium Silicon Oxide.

6. The apparatus of claim 1, the apparatus further comprising a hard mask comprising Magnesium Oxide.

7. The apparatus of claim 6, the hard mask further comprising one or more of Aluminum, Silicon, or Hafnium.

8. The apparatus of claim 1, wherein the etch stop layer has a crystallization temperature that is higher than 1000 degrees Celsius.

9. The apparatus of claim 1, wherein the etch stop layer has a dry etch rate that is lower than a dry etch rate of Al2O3.

10. The apparatus of claim 1, wherein the apparatus comprises a 3D NAND memory device.

11. The apparatus of claim 1, wherein the etch stop layer is a blanket etch stop layer deposited over the entire surface of a wafer.

12. The apparatus of claim 1, wherein the etch stop layer comprises a plurality of etch stop portions formed in holes of a dielectric layer formed on a wafer.

13. The apparatus of claim 6, wherein the hard mask comprising Magnesium Oxide is disposed above a top insulating layer of the tier.

* * * * *